(12) United States Patent
Wang et al.

(10) Patent No.: US 11,956,972 B2
(45) Date of Patent: Apr. 9, 2024

(54) SEMICONDUCTOR MEMORY DEVICE AND FABRICATION METHOD THEREOF (71) Applicant: UNITED MICROELECTRONICS CORP., Hsin-Chu (TW)

(72) Inventors: Hui-Lin Wang, Taipei (TW); Si-Han Tsai, Taichung (TW); Ching-Hua Hsu, Kaohsiung (TW); Chen-Yi Weng, New Taipei (TW); Po-Kai Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 280 days.

(21) Appl. No.: 17/228,720

(22) Filed: Apr. 13, 2021

(65) Prior Publication Data
US 2022/0310697 A1    Sep. 29, 2022

(30) Foreign Application Priority Data

Mar. 29, 2021   (TW) .................................. 110111317

(51) Int. Cl.
H10B 61/00    (2023.01)
H10N 50/01    (2023.01)
H10N 50/10    (2023.01)
H10N 50/80    (2023.01)

(52) U.S. Cl.
CPC ............. *H10B 61/00* (2023.02); *H10N 50/01* (2023.02); *H10N 50/10* (2023.02); *H10N 50/80* (2023.02)

(58) Field of Classification Search
CPC ........ H10B 61/00; H10N 50/01; H10N 50/10; H10N 50/80
See application file for complete search history.

(56) References Cited

U.S. PATENT DOCUMENTS

| 10,629,802 | B1 * | 4/2020 | Chiu | H10B 61/00 |
| 11,139,428 | B2 * | 10/2021 | Wang | G11C 11/161 |
| 11,355,700 | B2 * | 6/2022 | Wang | H10N 50/80 |
| 2020/0388648 | A1 * | 12/2020 | Kuo | H10B 61/20 |

* cited by examiner

Primary Examiner — Jay C Kim
Assistant Examiner — Woo K Lee
(74) Attorney, Agent, or Firm — Winston Hsu (57) ABSTRACT A semiconductor memory device includes a substrate having a memory area and a logic circuit area thereon, a first interlayer dielectric layer on the substrate, and a second interlayer dielectric layer on the substrate. An embedded memory cell structure is disposed within the memory area between the first interlayer dielectric layer and the second interlayer dielectric layer. The second interlayer dielectric layer includes a first portion covering the embedded memory cell structure within the memory area and a second portion covering the logic circuit area. A top surface of the first portion is coplanar with a top surface of the second portion.

17 Claims, 5 Drawing Sheets

SEMICONDUCTOR MEMORY DEVICE AND FABRICATION METHOD THEREOF

BACKGROUND OF THE INVENTION

1. Field of the Invention

The present invention relates to the field of semiconductor technology, and particularly relates to a semiconductor memory device and a manufacturing method thereof.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. The characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

It is one object of the present invention to provide a semiconductor device and a manufacturing method thereof to solve the above-mentioned drawbacks or shortcomings of the prior art.

One aspect of the invention provides a semiconductor memory device including a substrate comprising a memory area and a logic circuit area; a first interlayer dielectric layer on the substrate; a second interlayer dielectric layer on the substrate; and an embedded memory cell structure disposed within the memory area between the first interlayer dielectric layer and the second interlayer dielectric layer. The second interlayer dielectric layer comprises a first portion covering the embedded memory cell structure within the memory area, and a second portion covering the logic circuit area. A top surface of the first portion is coplanar with a top surface of the second portion.

According to some embodiments, the first interlayer dielectric layer and the second interlayer dielectric layer comprise an ultra-low dielectric constant (ULK) dielectric layer.

According to some embodiments, the first portion has a thickness smaller than that of the second portion.

According to some embodiments, the semiconductor memory device further comprises an etch stop layer between the first interlayer dielectric layer and the second interlayer dielectric layer.

According to some embodiments, the etch stop layer comprises a nitride-doped silicon carbide (NDC) layer.

According to some embodiments, the second interlayer dielectric layer is in direct contact with the etch stop layer.

According to some embodiments, the embedded memory cell structure comprises a plurality of storage elements embedded in a dielectric stack.

According to some embodiments, the dielectric stack comprises a lower dielectric layer, a cap layer, and an upper oxide layer.

According to some embodiments, the lower dielectric layer comprises a TEOS-based oxide layer, the cap layer comprises a silicon nitride layer, and the upper oxide layer comprises a silicon oxide layer.

According to some embodiments, the plurality of storage elements comprises magnetic tunnel junction (MTJ) elements.

Another aspect of the invention provides a method of forming a semiconductor memory device. A substrate comprising a memory area and a logic circuit area is provided. A first interlayer dielectric layer is formed on the substrate. A second interlayer dielectric layer is formed on the substrate. An embedded memory cell structure is formed within the memory area between the first interlayer dielectric layer and the second interlayer dielectric layer. The second interlayer dielectric layer comprises a first portion covering the embedded memory cell structure within the memory area and a second portion covering the logic circuit area. A top surface of the first portion is coplanar with a top surface of the second portion.

According to some embodiments, the first interlayer dielectric layer and the second interlayer dielectric layer comprise an ultra-low dielectric constant (ULK) dielectric layer.

According to some embodiments, the first portion has a thickness smaller than that of the second portion.

According to some embodiments, the method further comprises the step of forming an etch stop layer between the first interlayer dielectric layer and the second interlayer dielectric layer.

According to some embodiments, the etch stop layer comprises a nitride-doped silicon carbide (NDC) layer.

According to some embodiments, the second interlayer dielectric layer is in direct contact with the etch stop layer.

According to some embodiments, the embedded memory cell structure comprises a plurality of storage elements embedded in a dielectric stack.

According to some embodiments, the dielectric stack comprises a lower dielectric layer, a cap layer, and an upper oxide layer.

According to some embodiments, the lower dielectric layer comprises a TEOS-based oxide layer, the cap layer comprises a silicon nitride layer, and the upper oxide layer comprises a silicon oxide layer.

According to some embodiments, the plurality of storage elements comprises magnetic tunnel junction (MTJ) elements.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

In the following detailed description, Mn represents the different metal layers in the metal interconnect structure, where n is a positive integer. For example, M1 represents the first metal layer in the metal interconnect structure, and M2 represents the second metal layer in the metal interconnect structure, and so on. Vn represents the different conductive vias in the metal interconnection structure. For example, V1 represents the conductive via connecting M1 to M2, and V2 represents the conductive via connecting M2 to M3, and so on.

The present invention relates to a method for manufacturing a semiconductor memory device, for example, a magnetoresistive random access memory (MRAM) device. One technical feature is that two deposition processes for depositing polishing stop layers and two planarization processes are used to form a flat surface of the ultra-low permittivity (ULK) dielectric layer that covers the storage elements (such as the MTJ array) in the memory area and the logic circuit area, so that copper metal residue and potential bit line shorting can be avoided.

Figure 1:
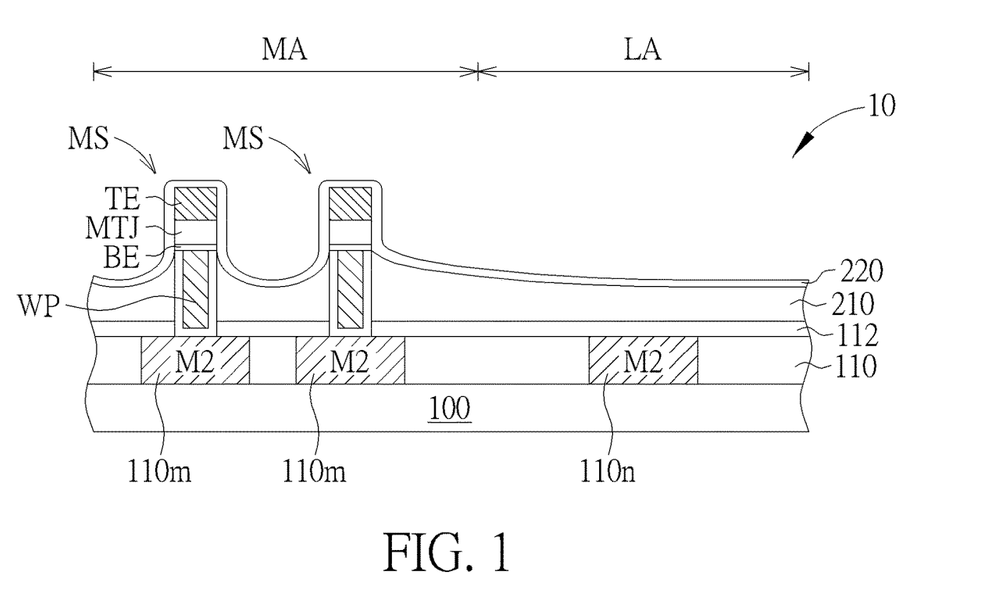
FIG. 1 to FIG. 10 are schematic diagrams illustrating a method of forming a semiconductor memory device according to an embodiment of the present invention.

Please refer to FIG. 1 to FIG. 10, which are schematic diagrams of a method of forming a semiconductor memory device 10 according to an embodiment of the present invention. As shown in FIG. 1, a substrate 100 is first provided. For example, the substrate 100 may include a semiconductor substrate, but is not limited thereto. According to an embodiment of the present invention, the substrate 100 includes a memory area MA and a logic circuit area LA. According to an embodiment of the present invention, a first interlayer dielectric layer 110 is formed on the substrate 100, for example, an ultra-low dielectric constant (ULK) dielectric layer. The dielectric constant of the ULK dielectric layer may be lower than 3.0, for example, 1.5, but it is not limited to this.

According to an embodiment of the present invention, an interconnect structure 110m and an interconnect structure 110n may be formed in the first interlayer dielectric layer 110. The interconnect structure 110m may be formed in the memory area MA, and the interconnect structure 110n may be formed in the logic circuit area LA. According to an embodiment of the present invention, for example, the interconnect structure 110m and the interconnect structure 110n may be located in the second metal layer M2, but are not limited thereto. According to an embodiment of the present invention, for example, the interconnect structure 110m and the interconnect structure 110n may be a copper metal layer, for example, a copper damascene structure.

According to an embodiment of the present invention, an etch stop layer 112 is formed on the first interlayer dielectric layer 110. According to an embodiment of the present invention, for example, the etch stop layer 112 may include a nitrogen-doped silicon carbide (NDC) layer, but is not limited thereto. Next, a lower dielectric layer 210 is formed on the etch stop layer 112. According to an embodiment of the present invention, for example, the lower dielectric layer 210 may include a tetraethoxysilane (TEOS)-based silicon oxide layer, but is not limited thereto.

Subsequently, a plurality of storage elements MS, such as magnetic tunnel junction (MTJ) elements, may be formed in the memory area MA. Since the storage elements of the MRAM device is made by well-known techniques, the details will not be repeated. For example, a tungsten via WP electrically connected to the underlying interconnect structure 110m is formed in the lower dielectric layer 210, and then a conductive layer, an insulating layer, and a magnetic material layer are deposited on the tungsten via WP and the lower dielectric layer 210, and the storage element MS is then defined on the tungsten via WP by etching, for example, an ion beam etching (IBE) method. Finally, a cap layer 220 is deposited conformally on the storage element MS and the lower dielectric layer 210. For example, the cap layer 220 may include a silicon nitride layer, but is not limited thereto.

According to an embodiment of the present invention, for example, the storage element MS may generally include the tungsten via WP located in the lower dielectric layer 210, a bottom electrode BE located on the tungsten via WP, a storage structure MTJ located on the bottom electrode BE, and a top electrode TE located on the storage structure MTJ. According to an embodiment of the present invention, for example, the storage structure MTJ may generally include a reference layer, a tunnel barrier, and a free layer (not shown in the figure). The reference layer and the free layer may be made of ferromagnetic materials, and the tunnel barrier may be made of insulating material, but it is not limited to this.

Figure 2:
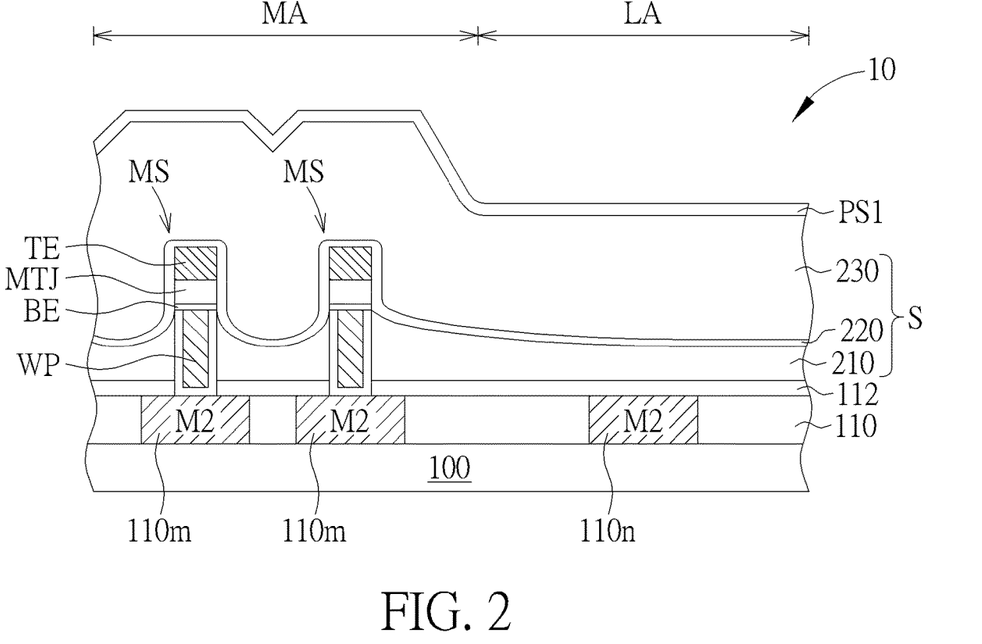

As shown in FIG. 2, according to an embodiment of the present invention, after the storage element MS is completed in the memory area MA and the cap layer 220 is deposited, an upper oxide layer 230 is deposited on the substrate 100 in a blanket manner. According to an embodiment of the present invention, the upper oxide layer 230 covers the cap layer 220 and fills the space between the storage elements MS. At this point, the top surface of the upper oxide layer 230 in the memory area MA is higher than its top surface in the logic circuit area LA, and the top surface of the upper oxide layer 230 in the logic circuit area LA is higher than the top of the storage element MS. According to an embodiment of the present invention, for example, the upper oxide layer 230 may include a silicon oxide layer, but is not limited thereto. The upper oxide layer 230, the cap layer 220 and the lower dielectric layer 210 constitute a dielectric stack S. The plurality of storage elements MS are embedded in the dielectric stack S. According to an embodiment of the present invention, for example, the upper oxide layer 230 may be formed by an atomic layer deposition (ALD) method, but is not limited thereto. Subsequently, a first polishing stop layer PS1, for example, a silicon nitride layer, is deposited on the upper oxide layer 230.

Figure 3:
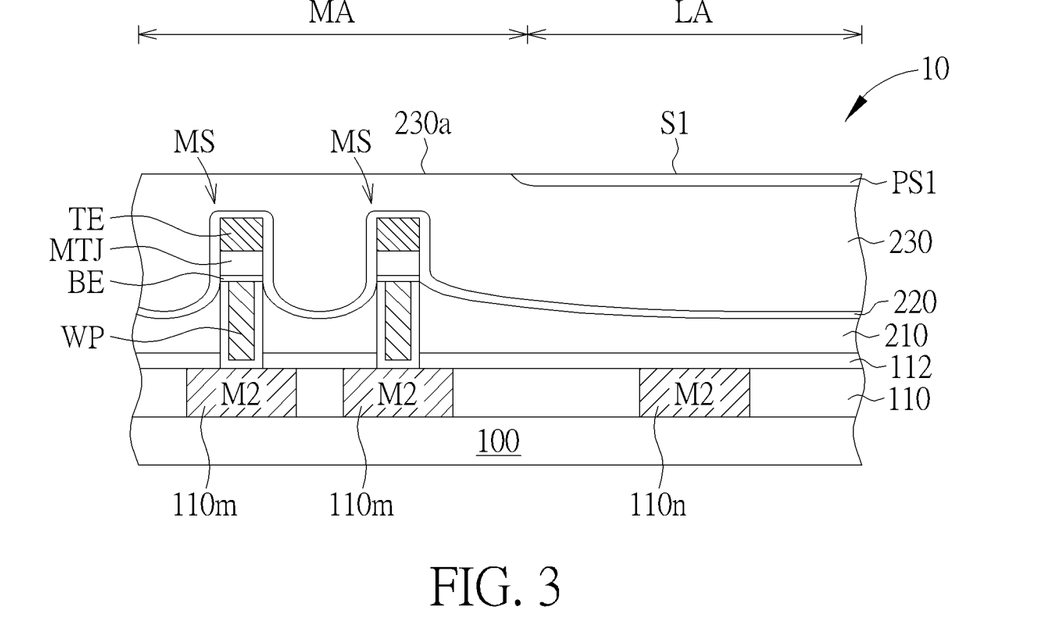
Figure 4:
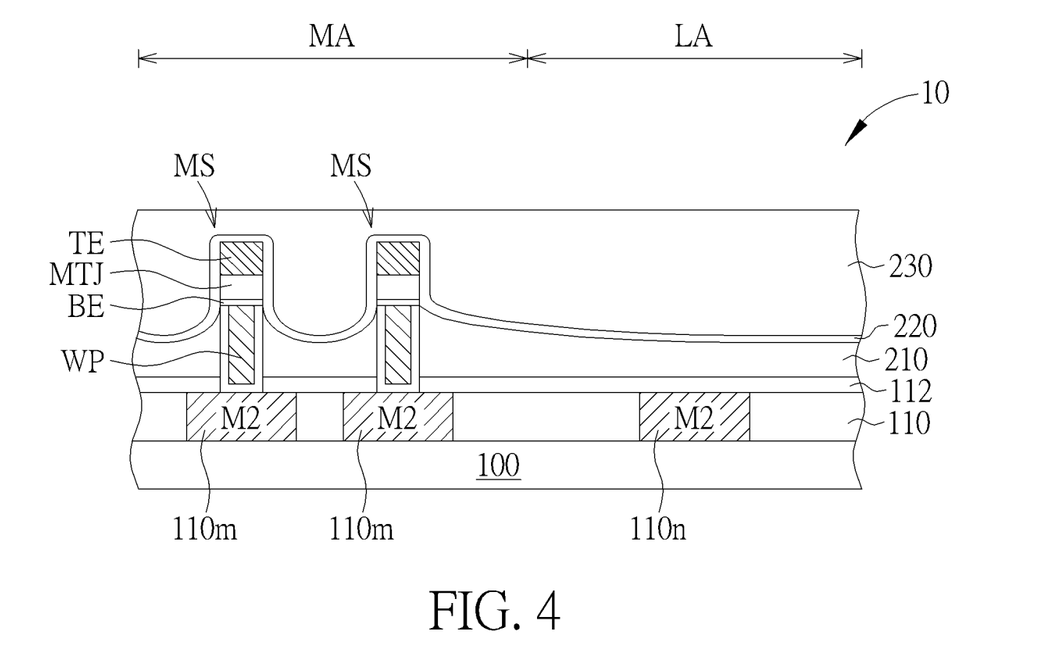

As shown in FIG. 3, a chemical mechanical polishing (CMP) process is then performed. First, the first polishing stop layer PS1 in the memory area MA is polished, and then the polishing of the upper oxide layer 230 in the memory area MA is continued. The polish stops on the first polishing stop layer PS1 in the logic circuit area LA. According to an embodiment of the present invention, at this point, the top surface 230a of the upper oxide layer 230 in the memory area MA and the top surface S1 of the first polishing stop layer PS1 in the logic circuit area LA are approximately coplanar As shown in FIG. 4, an etch-back process is then performed, for example, a plasma dry etching process to simultaneously etch the first polishing stop layer PS1 in the logic circuit area LA and the upper oxide layer 230 in the memory area MA. According to an embodiment of the present invention, after the first polishing stop layer PS1 in the logic circuit area LA is completely etched away, the upper oxide layer 230 presents a flat top surface.

Figure 5:
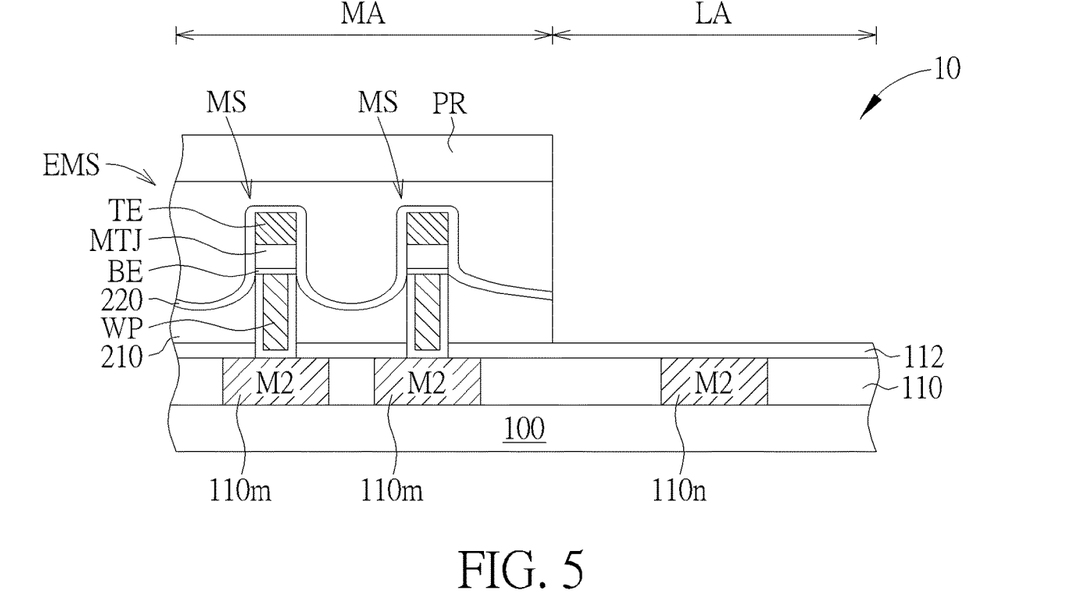

As shown in FIG. 5, a lithographic process is then performed to form a photoresist pattern PR on the upper oxide layer 230, and the photoresist pattern PR covers the upper oxide layer 230 in the memory area MA, while the upper oxide layer 230 in the logic circuit area LA is exposed. According to an embodiment of the present invention, an etching process may be performed, for example, an anisotropic dry etching process to etch away the upper oxide layer 230, the cap layer 220, and the lower dielectric layer 210 in the logic circuit area LA, which are not covered by the photoresist pattern PR, thereby exposing the etch stop layer 112 in the logic circuit area LA and forming an embedded memory cell structure EMS in the memory area MA. The embedded memory cell structure EMS includes the plurality of storage elements MS embedded in the dielectric stack S. Subsequently, the remaining photoresist pattern PR may be removed.

Figure 6:
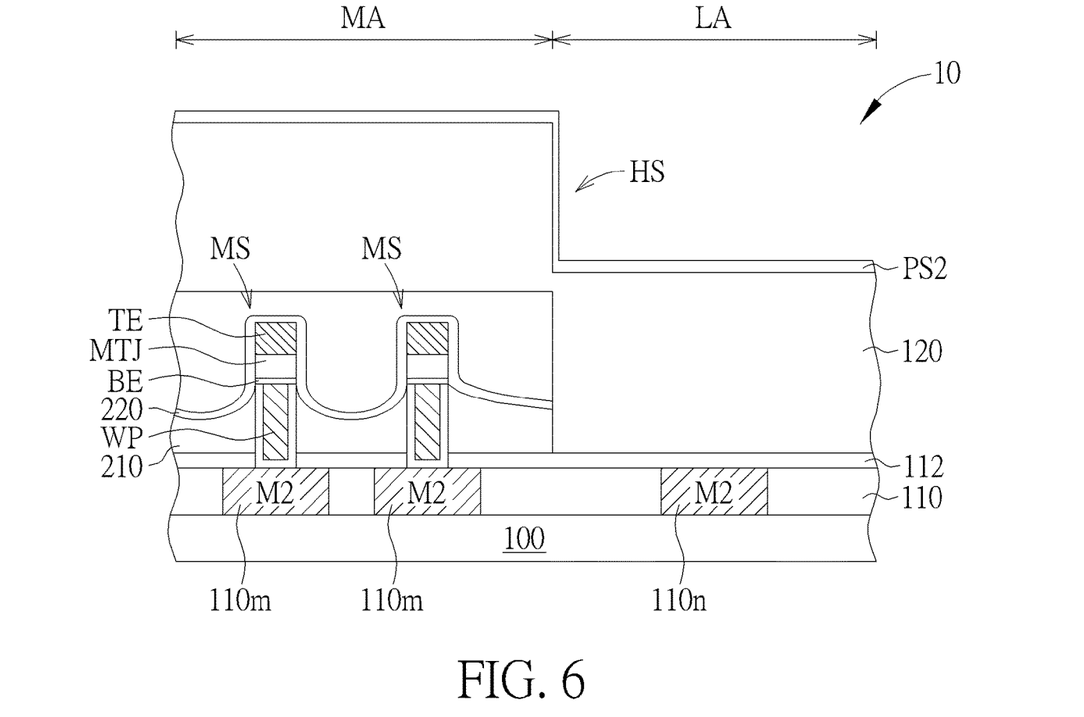

As shown in FIG. 6, a second interlayer dielectric layer 120, for example, an ultra-low dielectric constant (ULK) dielectric layer is deposited on the substrate 100 in a blanket manner. The dielectric constant of the ULK dielectric layer may be lower than 3.0, for example, 1.5, but not limited thereto. The second interlayer dielectric layer 120 covers the etch stop layer 112 in the logic circuit area LA and the embedded memory cell structure EMS in the memory area MA. According to an embodiment of the present invention, the second interlayer dielectric layer 120 directly contacts the etch stop layer 112. At this point, the second interlayer dielectric layer 120 presents an obvious step height HS between the memory area MA and the logic circuit area LA. Subsequently, a second polishing stop layer PS2, for example, a silicon nitride layer, is deposited on the second interlayer dielectric layer 120 in a blanket manner.

Figure 7:
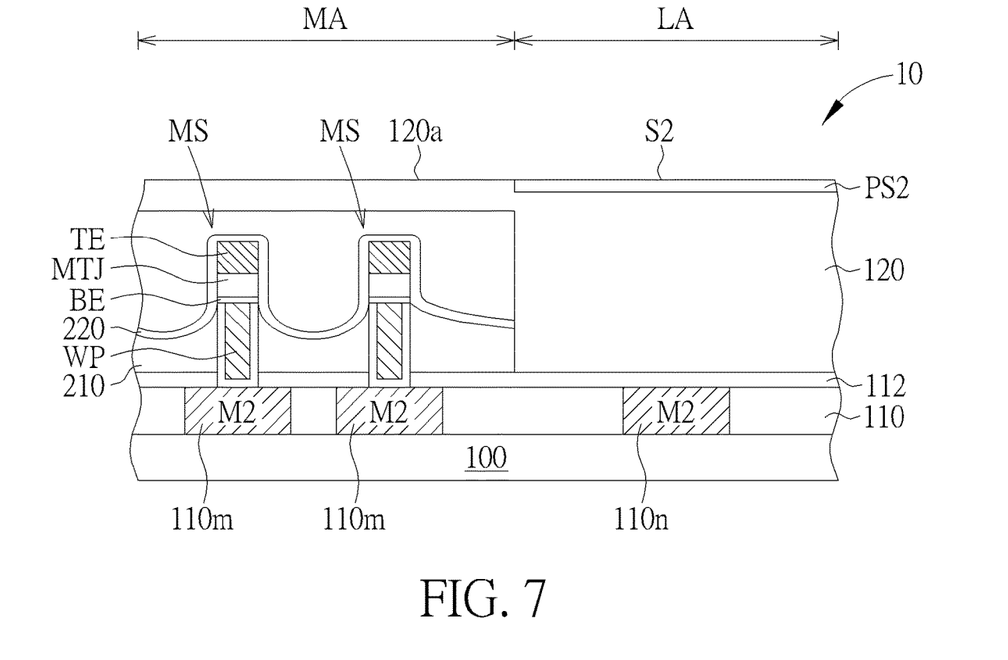

As shown in FIG. 7, a chemical mechanical polishing (CMP) process is then performed. The second polishing stop layer PS2 in the memory area MA is first polished, and then the second interlayer dielectric layer 120 in the memory area MA is polished, and the polish stops on the second polishing stop layer PS2 in the logic circuit area LA. According to an embodiment of the present invention, at this point, the top surface 120a of the second interlayer dielectric layer 120 in the memory area MA and the top surface S2 of the second polishing stop layer PS2 in the logic circuit area LA are approximately coplanar.

Figure 8:
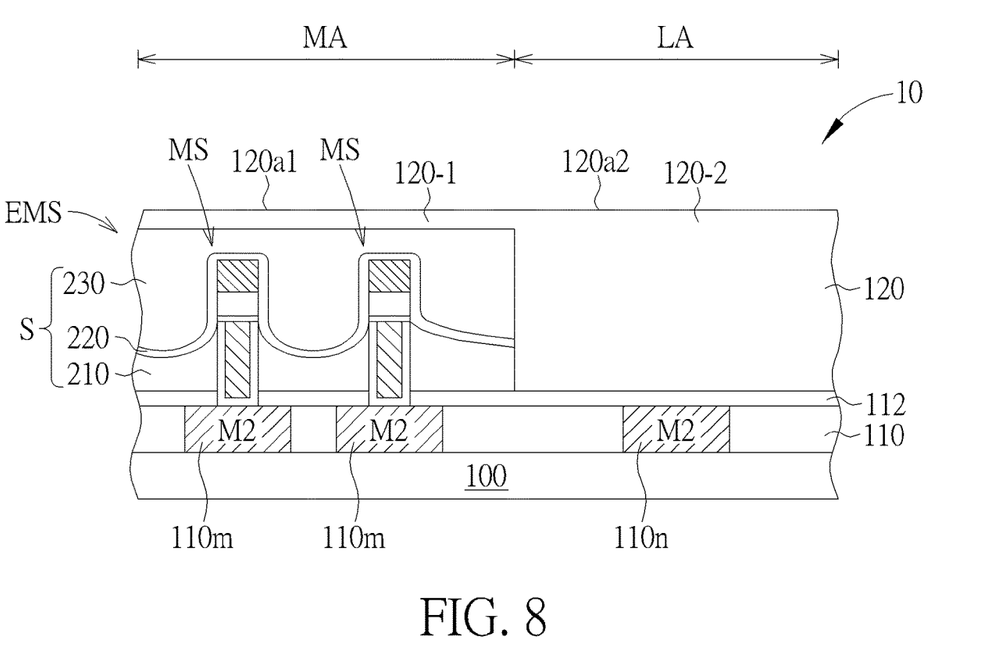

As shown in FIG. 8, an etch-back process is then performed, for example, a plasma dry etching process, to simultaneously and non-selectively etch the second polishing stop layer PS2 in the logic circuit area LA and the second interlayer dielectric layer 120 in the memory area MA. According to an embodiment of the present invention, after the second polishing stop layer PS2 in the logic circuit area LA is completely etched away, the second interlayer dielectric layer 120 presents a flat top surface. According to an embodiment of the present invention, the second interlayer dielectric layer 120 includes a first portion 120-1 covering the embedded memory cell structure EMS in the memory area MA, and a second portion 120-2 covering the logic circuit area LA. The top surface 120a1 of the first portion 120-1 and the top surface 120a2 of the second portion 120-2 are coplanar, and the thickness of the first portion 120-1 is smaller than the thickness of the second portion 120-2.

Figure 9:
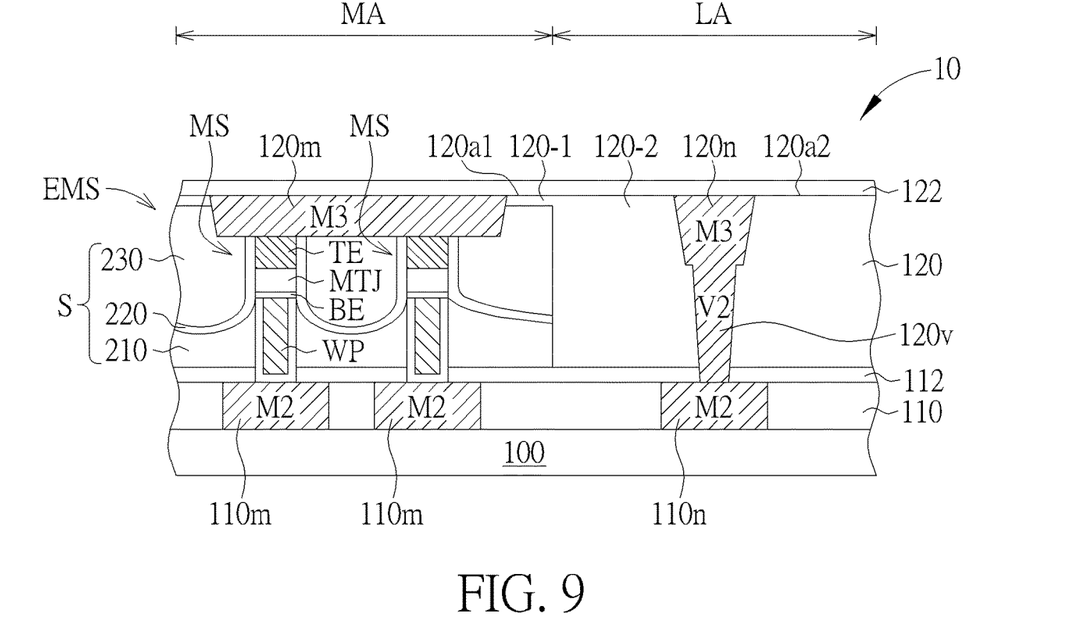

As shown in FIG. 9, a metallization process, such as a copper damascene process, is then performed to form an interconnect structure 120m in the second interlayer dielectric layer 120 and the upper oxide layer 230 in the memory area MA, which is electrically connected to the top electrode TE of the memory element MS. An interconnect structure 120n and a conductive via 120v are also formed in the second interlayer dielectric layer 120 in the logic circuit area LA. According to an embodiment of the present invention, for example, the interconnect structure 120m and the interconnect structure 120n may be located in the third metal layer M3. The conductive via 120v may penetrate through the etch stop layer 112 and be electrically connected to the underlying interconnect structure 110n. Subsequently, an etch stop layer 122 is deposited on the second interlayer dielectric layer 120 and the interconnect structure 120m and the interconnect structure 120n. According to an embodiment of the present invention, for example, the etch stop layer 122 may include a nitrogen-doped silicon carbide layer, but is not limited thereto.

Since the top surface of the second interlayer dielectric layer 120 in the memory area MA is flat when the interconnect structure 120m and the interconnect structure 120n are formed, the copper metal residue and potential bit line shorting can be avoided.

Figure 10:
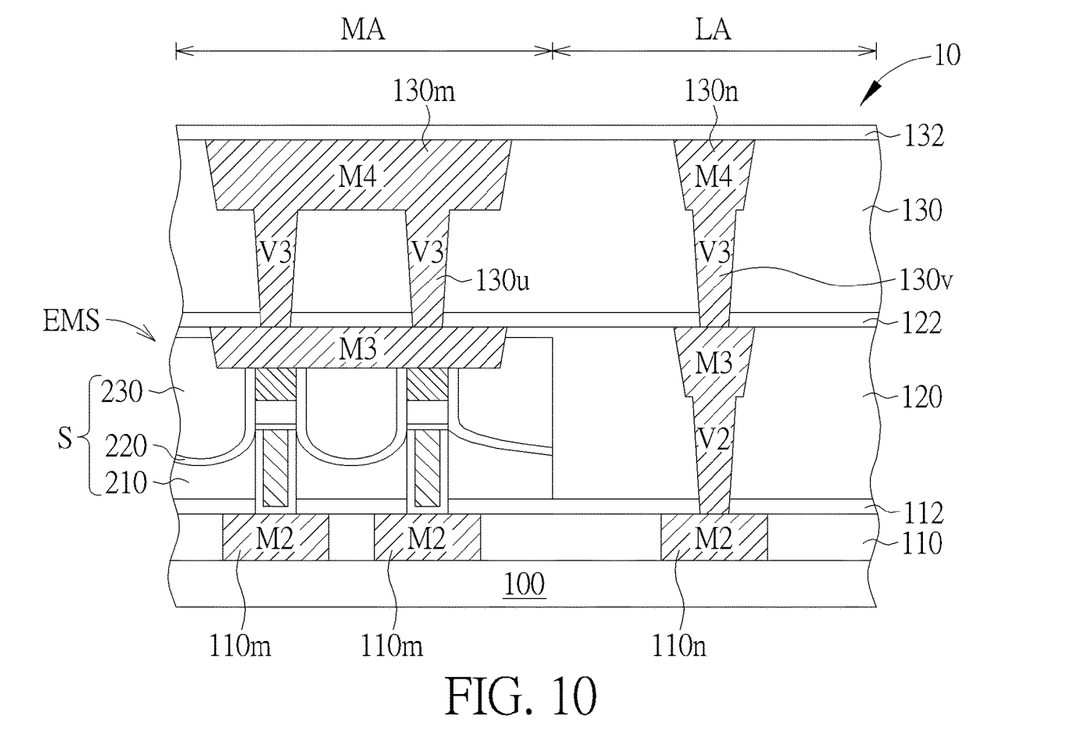

As shown in FIG. 10, a third interlayer dielectric layer 130, for example, an ultra-low dielectric constant (ULK) dielectric layer is deposited on the substrate 100 in a blanket manner. The dielectric constant of the ULK dielectric layer may be lower than 3.0, for example, 1.5, but not limited thereto. The third interlayer dielectric layer 130 covers the etch stop layer 122 in the memory area MA and the logic circuit area LA. Next, a metallization process, such as a copper damascene process, is performed to form an interconnect structure 130m and a conductive via 130u in the third interlayer dielectric layer 130 in the memory area MA, which are electrically connected to the underlying interconnect structure 120m. An interconnect structure 130n and a conductive via 130v are formed in the third interlayer dielectric layer 130 in the logic circuit area LA.

According to an embodiment of the present invention, for example, the interconnect structure 130m and the interconnect structure 130n may be located in the fourth metal layer M4. The conductive via 130u and the conductive via 130v may penetrate through the etch stop layer 122 and be electrically connected to the underlying interconnect structures 120m and 120n, respectively. Then, an etch stop layer 132 is deposited on the third interlayer dielectric layer 130 and the interconnect structure 130m and the interconnect structure 130n. According to an embodiment of the present invention, for example, the etch stop layer 132 may include a nitrogen-doped silicon carbide layer, but is not limited thereto.

Structurally, as shown in FIG. 8, the semiconductor memory device 10 includes a substrate 100, which includes a memory area MA and a logic circuit area LA. A first interlayer dielectric layer 110 is disposed on the substrate 100. A second interlayer dielectric layer 120 is disposed on the first interlayer dielectric layer 110 and the substrate 100.

An embedded memory cell structure EMS is disposed between the first interlayer dielectric layer 110 and the second interlayer dielectric layer 120 in the memory area MA. The second interlayer dielectric layer 120 includes a first portion 120-1 covering the embedded memory cell structure EMS in the memory area MA, and a second portion 120-2 covering the logic circuit area LA. The top surface 120a1 of the first portion 120-1 and the top surface 120a2 of the second portion 120-2 are coplanar.

According to an embodiment of the present invention, the first interlayer dielectric layer 110 and the second interlayer dielectric layer 120 include ultra-low dielectric constant dielectric layers.

According to an embodiment of the present invention, the thickness of the first portion 120-1 is smaller than the thickness of the second portion 120-2.

According to an embodiment of the present invention, the semiconductor memory device 10 further includes an etch stop layer 112 disposed between the first interlayer dielectric layer 110 and the second interlayer dielectric layer 120. According to an embodiment of the present invention, the etch stop layer 112 includes a nitrogen-doped silicon carbide layer. According to an embodiment of the present invention, the second interlayer dielectric layer 120 directly contacts the etch stop layer 112.

According to an embodiment of the present invention, the embedded memory cell structure EMS includes a plurality of memory elements MS embedded in the dielectric stack S. According to an embodiment of the present invention, the dielectric stack S includes a lower dielectric layer 210, a cap layer 220, and an upper oxide layer 230. According to an embodiment of the present invention, the lower dielectric layer 210 includes a tetraethoxysilane (TEOS)-based silicon oxide layer, the cap layer 220 includes a silicon nitride layer, and the upper oxide layer 230 includes a silicon oxide layer.

According to an embodiment of the present invention, the plurality of storage elements MS includes magnetic tunnel junction (MTJ) elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate comprising a memory area and a logic circuit area;
   a first interlayer dielectric layer on the substrate;
   a second interlayer dielectric layer on the substrate; and
   an embedded memory cell structure disposed within the memory area between the first interlayer dielectric layer and the second interlayer dielectric layer, wherein the embedded memory cell structure comprises a plurality of storage elements embedded in a dielectric stack, wherein the dielectric stack comprises a lower dielectric layer, a cap layer, and an upper oxide layer, wherein the second interlayer dielectric layer comprises a first portion covering the embedded memory cell structure within the memory area, and a second portion covering the logic circuit area, wherein a top surface of the first portion is coplanar with a top surface of the second portion, wherein the first portion covers a top surface of the embedded memory cell structure, and wherein a top surface of the first portion is higher than the top surface of the embedded memory cell structure, wherein the lower dielectric layer does not extend into the logic circuit area, and the lower dielectric layer is in direct contact with the second interlayer dielectric layer.

2. The semiconductor memory device according to claim 1, wherein the first interlayer dielectric layer and the second interlayer dielectric layer comprise an ultra-low dielectric constant (ULK) dielectric layer.

3. The semiconductor memory device according to claim 1, wherein the first portion has a thickness smaller than a thickness of the second portion.

4. The semiconductor memory device according to claim 1 further comprising:
   an etch stop layer between the first interlayer dielectric layer and the second interlayer dielectric layer.

5. The semiconductor memory device according to claim 4, wherein the etch stop layer comprises a nitride-doped silicon carbide (NDC) layer.

6. The semiconductor memory device according to claim 4, wherein the second interlayer dielectric layer is in direct contact with the etch stop layer.

7. The semiconductor memory device according to claim 1, wherein the lower dielectric layer comprises a TEOS-based oxide layer, the cap layer comprises a silicon nitride layer, and the upper oxide layer comprises a silicon oxide layer.

8. The semiconductor memory device according to claim 1, wherein the plurality of storage elements comprises magnetic tunnel junction (MTJ) elements.

9. A method of forming a semiconductor memory device, comprising:
   providing a substrate comprising a memory area and a logic circuit area;
   forming a first interlayer dielectric layer on the substrate;
   forming a second interlayer dielectric layer on the substrate; and
   forming an embedded memory cell structure within the memory area between the first interlayer dielectric layer and the second interlayer dielectric layer, wherein the embedded memory cell structure comprises a plurality of storage elements embedded in a dielectric stack, wherein the dielectric stack comprises a lower dielectric layer, a cap layer, and an upper oxide layer, wherein the second interlayer dielectric layer comprises a first portion covering the embedded memory cell structure within the memory area and a second portion covering the logic circuit area, wherein a top surface of the first portion is coplanar with a top surface of the second portion, wherein the first portion covers a top surface of the embedded memory cell structure, and wherein a top surface of the first portion is higher than the top surface of the embedded memory cell structure, wherein the lower dielectric layer does not extend into the logic circuit area, and the lower dielectric layer is in direct contact with the second interlayer dielectric layer.

10. The method according to claim 9, wherein the first interlayer dielectric layer and the second interlayer dielectric layer comprise an ultra-low dielectric constant (ULK) dielectric layer.

11. The method according to claim 9, wherein the first portion has a thickness smaller than a thickness of the second portion.

12. The method according to claim 9 further comprising:
    forming an etch stop layer between the first interlayer dielectric layer and the second interlayer dielectric layer.

13. The method according to claim 12, wherein the etch stop layer comprises a nitride-doped silicon carbide (NDC) layer.

14. The method according to claim 12, wherein the second interlayer dielectric layer is in direct contact with the etch stop layer.

15. The method according to claim 9, wherein the lower dielectric layer comprises a TEOS-based oxide layer, the cap layer comprises a silicon nitride layer, and the upper oxide layer comprises a silicon oxide layer.

16. The method according to claim 9, wherein the plurality of storage elements comprises magnetic tunnel junction (MTJ) elements.

17. A semiconductor memory device, comprising:
a substrate comprising a memory area and a logic circuit area;
a first interlayer dielectric layer on the substrate;
a second interlayer dielectric layer on the substrate;
an embedded memory cell structure disposed within the memory area between the first interlayer dielectric layer and the second interlayer dielectric layer, wherein the embedded memory cell structure comprises a plurality of storage elements embedded in a dielectric stack, wherein the dielectric stack comprises a lower dielectric layer, a cap layer, and an upper oxide layer, wherein the second interlayer dielectric layer comprises a first portion covering the embedded memory cell structure within the memory area, and a second portion covering the logic circuit area, wherein a top surface of the first portion is coplanar with a top surface of the second portion, wherein the first portion covers a top surface of the embedded memory cell structure, and wherein a top surface of the first portion is higher than the top surface of the embedded memory cell structure, wherein the lower dielectric layer does not extend into the logic circuit area, and the lower dielectric layer is in direct contact with the second interlayer dielectric layer;
an interconnect structure embedded in the second interlayer dielectric layer and the upper oxide layer within the memory area, wherein the interconnect structure is electrically connected to the top electrodes of the plurality of storage elements, wherein a top surface of the interconnect structure is coplanar with the top surface of the first portion and the top surface of the second portion.

* * * * *